(12) United States Patent
Sakurada et al.

(10) Patent No.: US 7,365,359 B2
(45) Date of Patent: Apr. 29, 2008

(54) ORGANIC SEMICONDUCTOR MATERIAL AND ORGANIC SEMICONDUCTOR ELEMENT

(75) Inventors: Shinobu Sakurada, Gyoda (JP); Ken Tomino, Tokyo-to (JP); Hiroki Maeda, Tokyo-to (JP); Masanori Akada, Tokyo-to (JP); Jun-ichi Hanna, Yokohama (JP)

(73) Assignee: Dai Nippon Printing Co., Ltd., Tokyo-tu (JP)

( * ) Notice: Subject to any disclaimer, the term of this patent is extended or adjusted under 35 U.S.C. 154(b) by 190 days.

(21) Appl. No.: 10/698,002

(22) Filed: Oct. 30, 2003

(65) Prior Publication Data

US 2004/0201011 A1    Oct. 14, 2004

(30) Foreign Application Priority Data

Oct. 31, 2002  (JP) .............................. 2002-318932

(51) Int. Cl.
*H01L 51/00*   (2006.01)

(52) U.S. Cl. ...................... 257/40; 252/299.01; 438/99

(58) Field of Classification Search .................. 257/40, 257/642; 136/263; 252/299.1, 299.5, 299.01; 438/99

See application file for complete search history.

(56) References Cited

U.S. PATENT DOCUMENTS

| | | | | |
|---|---|---|---|---|
| 4,032,470 A | * | 6/1977 | Bloom et al. ............... | 349/163 |
| 4,141,627 A | * | 2/1979 | Bloom ....................... | 349/165 |
| 5,439,613 A | * | 8/1995 | Takeshita et al. ....... | 252/299.63 |
| 5,585,483 A | * | 12/1996 | Tamura et al. ............. | 540/122 |
| 6,858,079 B2 | * | 2/2005 | Norris et al. ............. | 117/70 |
| 7,102,154 B2 | * | 9/2006 | Hanna et al. ............. | 257/40 |
| 7,259,390 B2 | * | 8/2007 | Hanna et al. ............. | 257/40 |

FOREIGN PATENT DOCUMENTS

| | | | |
|---|---|---|---|
| JP | 2001-33990 | * | 2/2001 |
| JP | 2001-75297 | * | 3/2001 |
| JP | EP 1489141 A1 | * | 12/2004 |

OTHER PUBLICATIONS

JPO Website Machine English Translation of JP 2001-075297, Junichi Hanna et al., Mar. 23, 2001.*

* cited by examiner

*Primary Examiner*—Callie Shushu
*Assistant Examiner*—Sow-Fun Hon
(74) *Attorney, Agent, or Firm*—Harness, Dickey & Pierce P.L.C.

(57) ABSTRACT

An organic semiconductor material having high charge mobility characteristics and an organic semiconductor element is provided. The organic semiconductor material has rodlike low-molecular liquid crystallinity, including a skeleton structure comprising L 6 π electron aromatic rings, M 10 π electron aromatic rings, and N 14π electron aromatic rings, wherein L, M, and N are each an integer of 0 (zero) to 4 and L+M+N=1 to 4; and a terminal structure attached to both ends of the skeleton structure. The terminal structure can develop liquid crystallinity. The phase angle θ of impedance of the organic semiconductor material is $-80° \leq \theta \leq -90°$ as determined in the measurement of impedance in a frequency f range of $100\,\mathrm{Hz} \leq f \leq 1\,\mathrm{MHz}$ in such a state that the organic semiconductor material in an isotropic phase state is held between a pair of opposed substrates with an interelectrode spacing of 9 μm.

2 Claims, 2 Drawing Sheets

ORGANIC SEMICONDUCTOR MATERIAL AND ORGANIC SEMICONDUCTOR ELEMENT

BACKGROUND OF THE INVENTION

1. Field of the Invention

The present invention relates to an organic semiconductor material having rodlike low-molecular liquid crystallinity with a high level of charge mobility characteristics, and an organic semiconductor element using the organic semiconductor material.

2. Background Art

In recent years, attention has been drawn to studies on organic semiconductor elements using organic semiconductor materials, and such organic semiconductor elements are expected to be applied to various devices. Devices, to which organic semiconductor elements are applied, include, for example, thin-film transistors (known also as "organic TFT"), luminescent elements, and solar batteries, which utilize the organic semiconductor material in a functional layer.

What is required of organic semiconductor elements for utilization in these applications on a practical level is to have high charge mobility. To meet this requirement, the development of organic semiconductor materials having high charge mobility and the studies on an improvement in charge mobility have been made (for example, Japanese Patent Laid-Open No. 312711/1998).

In the prior art techniques, however, the development of charge mobility on a practical level has not been always achieved, and, thus, a further improvement in charge mobility has been demanded.

SUMMARY OF THE INVENTION

Accordingly, an object of the present invention is to provide an organic semiconductor material having high charge mobility characteristics and to provide an organic semiconductor element using the same.

The above object can be attained by an organic semiconductor material having rodlike low-molecular liquid crystallinity, comprising: a skeleton structure comprising L 6π electron aromatic rings, M 10π electron aromatic rings, and N 14π electron aromatic rings, wherein L, M, and N are each an integer of 0 (zero) to 4 and L+M+N=1 to 4; and a terminal structure attached to both ends of said skeleton structure, said terminal structure being capable of developing liquid crystallinity, the phase angle θ of impedance of said organic semiconductor material being −80°≦θ≦−90° as determined in the measurement of impedance in a frequency f range of 100 Hz≦f≦1 MHz in such a state that said organic semiconductor material in an isotropic phase state is held between a pair of opposed substrates with an interelectrode spacing of 9 μm.

The organic semiconductor material specified by the measurement of impedance has high charge mobility on a practical level and thus can be suitably applied to devices of organic semiconductor materials.

According to another aspect of the present invention, there is provided an organic semiconductor element comprising a functional layer comprising the above organic semiconductor material, said functional layer having been formed by heating said organic semiconductor material to a temperature high enough for the organic semiconductor material to exhibit at least a smectic phase and then cooling the organic semiconductor material, at least a part of said organic semiconductor material being in a crystal phase.

According to a further aspect of the present invention, there is provided an organic semiconductor element comprising a functional layer comprising the above organic semiconductor material, said organic semiconductor material exhibiting a smectic phase.

According to the organic semiconductor element comprising a functional layer comprising the organic semiconductor material according to the present invention, an excellent charge mobility of not less than $5 \times 10^{-3}$ cm$^2$ V$^{-1}$ s$^{-1}$ can be developed in a crystalline phase. Further, in a liquid crystal phase, a very high charge mobility of not less than $5 \times 10^{-2}$ cm$^2$ V$^{-1}$ s$^{-1}$ can be developed.

DETAILED DESCRIPTION OF THE INVENTION

Figure 1:
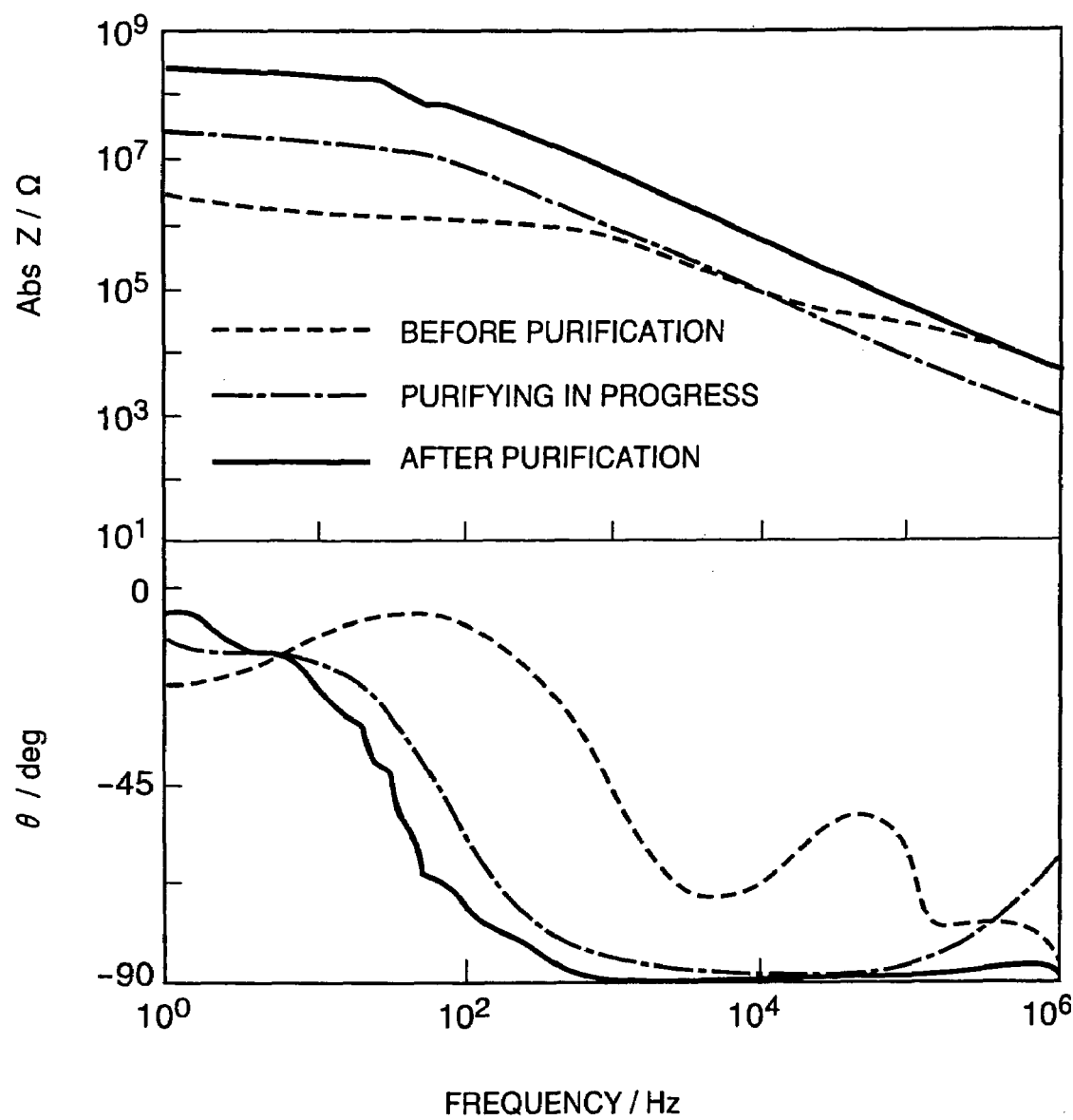
FIG. 1 is a diagram showing the results of measurement of impedance characteristics of an organic semiconductor material prepared in Example 1.

The organic semiconductor material and organic semiconductor element according to the present invention will be described.

1. Organic Semiconductor Material

The organic semiconductor material according to the present invention is a rodlike low-molecular liquid crystal material, and the skeleton structure (referred to also as "core structure") thereof comprises L 6π electron aromatic rings, M 10π electron aromatic rings, and N 14π electron aromatic rings, wherein L, M, and N are each an integer of 0 (zero) to 4 and L+M+N=1 to 4. The skeleton structure has on its both ends a terminal structure (referred to also as "terminal group") capable of developing liquid crystallinity.

6π electron aromatic rings constituting the skeleton structure include, for example, benzene, pyridine, pyrimidine, pyridazine, pyrazine, and tropolone rings. 10π electron aromatic rings constituting the skeleton structure include, for example, naphthalene, azulene, benzofuran, indole, imidazole, benzothiazole, benzoxazole, benzimidazole, quinoline, isoquinoline, quinazoline, and quinoxaline rings. 14π electron aromatic rings constituting the skeleton structure include, for example, phenanthrene and anthracene rings. The compounds having the above skeleton structures may be those disclosed in Japanese Patent Laid-Open No. 312711/1998.

A specific example of the terminal structure is one in which the above rigid skeleton structure has on its one end any one of H (a hydrogen atom), a halogen atom, a cyano group, a nitro group, a hydroxyl group and the like and on its other end a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. Examples of substituents include halogen atoms or cyano, sulfo, alkoxycarbonyl, alkoxy, hydroxy, aryloxy, acyloxy, aryl, and acyl groups.

Further, the terminal structure may be such that the skeleton structure has on its both ends a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. Examples of substituents include halogen atoms or cyano, sulfo, alkoxycarbonyl, alkoxy, hydroxy, aryloxy, acyloxy, aryl, and acyl groups.

The organic semiconductor material according to the present invention has impedance characteristics such that, when the impedance has been measured for an organic semiconductor material having the above skeleton structure and terminal structure and being in an isotropic phase, the phase angle θ of impedance is $-80°≦θ≦-90°$ as determined in the measurement of impedance in a frequency f range of $100\,Hz≦f≦1\,MHz$ in such a state that the organic semiconductor material is held between a pair of opposed substrates with an interelectrode spacing of 9 μm.

The organic semiconductor material having the above impedance characteristics can be provided by repeatedly purifying the organic semiconductor material to remove impurities (particularly impurities which contribute to ion conduction). The purification may be carried out, for example, by subjecting the organic semiconductor material to be purified to recrystallization, sublimation, distillation, zone melting, or column chromatography. In particular, in the recrystallization, the number of times of repetition of recrystallization, the solvent used, and other additional steps or the like can be properly selected according to the structure of the organic semiconductor material (skeleton structure and terminal structure), and, thus, optimal purification means can be provided.

The impedance characteristics can be evaluated using the purified organic semiconductor material under the following measurement conditions.

The measurement of the impedance is carried out using an organic semiconductor material in an isotropic phase state. This is because, in the isotropic phase state, the behavior of ion conductive impurities is likely to be significantly developed. The measurement of the impedance characteristics may be measured with a conventional commercially available apparatus. For example, an impedance/gain-phase analyzer SI-1260 (manufactured by SOLARTRON) as measurement equipment may be used in combination with a hot stage FP 82 HT/controller FP 80 HT (manufactured by METTLER) as a temperature controller. An opposed electrode cell comprising glass substrates each provided with an ITO electrode having a size of 10×5 mm$^2$ may be used as a measuring cell. The opposed electrodes can be formed by laminating opposed substrates on top of each other with the aid of a thermosetting adhesive. In this case, kneading silica beads with the thermosetting adhesive enables the regulation of the interelectrode spacing (cell gap) to 9 μm. In the present invention, evaluation is carried out based on measured values obtained at an interelectrode spacing (cell gap) of 9 μm. One example of measurement conditions is as follows.

Impressed AC voltage: 1 V
Bias DC voltage: not applied
Frequency range: 0.1 to 1 MHz
Sample temp.: kept using a hot stage at such a temperature that the organic semiconductor material exhibits an isotropic phase.

The organic semiconductor material according to the present invention is characterized in that the phase angle θ of impedance of the organic semiconductor material is $-80°≦θ≦-90°$ as determined in the measurement of impedance in a frequency f range of $100\,Hz≦f≦1\,MHz$.

The organic semiconductor material having a phase angle θ of impedance of $-80°≦θ≦-90°$ in the above frequency range has excellent charge mobility characteristics. The reason for this is as follows. In the case of the organic semiconductor material having the above impedance characteristics, the content of ion conductive impurities has been reduced by the purification. Therefore, there is no possibility that the charge transfer is hindered by the ion conductive impurities. Consequently, the mobility of charges (hole and/or electron) is improved.

When the phase angle θ is less than −80°, the removal of the ion conductive impurities by the purification is unsatisfactory and the charge transfer is hindered by the ion conductive impurities. Consequently, the dispersibility of the transient photocurrent as measured by a TOF (time-of-flight) method is enhanced, and satisfactory charge (hole and/or electron) mobility cannot be provided.

The charge mobility may be measured by a conventional method, that is, by pouring the organic semiconductor material into a cell comprising opposed substrates each provided with an ITO electrode and measuring the charge mobility by the TOF method (time-of-flight method).

The organic semiconductor material according to the present invention is a smectic (hereinafter referred to also as "Sm") liquid crystal phase material which has both crystalline properties and liquid crystalline properties and is fluid. Therefore, organic semiconductor material according to the present invention is also advantageous in that the material can be easily coated by means such as printing or coating. Further, the organic semiconductor material is characterized in that molecules are likely to be self-aligned by self-organization and the orientation is close to that in the crystal.

Examples of organic semiconductor materials according to the present invention include the following compounds I and II.

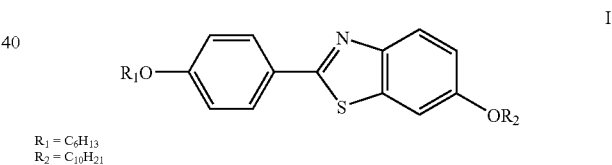

$R_1 = C_6H_{13}$
$R_2 = C_{10}H_{21}$

In the above organic semiconductor material, the functional layer of an organic semiconductor element, which will be described later, may be formed of a crystal phase of the rodlike low-molecular liquid-crystal material, and the organic semiconductor material according to the present invention has been found to have a charge mobility of not less than $5\times10^{-3}\,cm^2\,V^{-1}\,s^{-1}$.

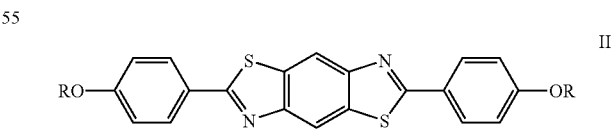

$R = C_{16}H_{33}$

In the above organic semiconductor material, the functional layer of an organic semiconductor element, which will be described later, may be formed of a higher order smectic phase of the rodlike low-molecular liquid-crystal material, and the organic semiconductor material according to the present invention has been found to have a very high charge mobility of not less than $5 \times 10^{-2}$ cm$^2$ V$^{-1}$ s$^{-1}$.

2. Organic Semiconductor Element

The organic semiconductor element according to the present invention includes a functional layer of the above organic semiconductor material. Functional layers may be classified into those which can be brought to a crystal phase and those which remain as a liquid crystal phase according to the type of organic semiconductor materials.

In the organic semiconductor material which can be brought to a crystal phase, a functional layer having a crystal phase at least in a part thereof, preferably in the whole part thereof can be formed by heating the organic semiconductor material to such a temperature that the organic semiconductor material exhibits at least a smectic phase and then cooling the organic semiconductor material. In this case, the temperature at which the smectic phase is exhibited is 40 to 350° C., and the temperature at which the crystal phase is exhibited is 40 to 300° C. Whether or not the functional layer thus obtained has a crystal phase can be judged by comparing the texture observed under a polarizing microscope with the texture in a liquid crystal state.

The functional layer may be formed by aligning the organic semiconductor material according to the present invention which has rodlike low-molecular liquid crystallinity. The organic semiconductor material can be aligned by stacking the organic semiconductor material on a liquid crystal aligning layer formed of a polyimide material or by stacking the organic semiconductor material on a liquid crystal aligning layer formed of a curable resin having on its surface fine concaves and convexes.

Since the organic semiconductor material is fluid at or above a temperature at which the liquid crystal state can be maintained, coating can be carried out in this state. According to this method, a large-area functional layer having excellent charge mobility characteristics can be very easily formed. In this case, various coating methods and printing methods can be applied for coating.

EXAMPLES

The following Examples further illustrate the present invention.

Example 1

A phenylbenzothiazole derivative (2-(4'-hexyloxyphenyl)-6-decyloxy-benzothiazole; hereinafter often abbreviated to "6O-PBT-O10") was synthesized as an organic semiconductor material according to the procedure shown in synthesis scheme 1 below.

At the outset, p-nitrophenol 1 (13.4 g, 96 mmol) and n-decyl iodide (25 g, 93 mmol) were dissolved in DMF (100 ml) to prepare a solution. Potassium carbonate (12.9 g) was added to the solution, and the mixture was stirred at 100° C. for about 2 hr. After the disappearance of the starting material was confirmed by TLC, the reaction mixture was allowed to cool to room temperature. Upon the addition of water and salt in an ice bath, solid matter was precipitated, and the solid was collected by filtration to give 4-decyloxynitrobenzene 2 (28.28 g, 110%) as a light yellow liquid.

Ethanol (100 ml) and concentrated hydrochloric acid (5 ml) were added to the 4-decyloxynitrobenzene 2 (28.3 g, 101 mmol) thus obtained to prepare a solution which was then cooled in an ice bath. A hydrochloric acid solution of tin(II) chloride dihydrate (101.3 g, 450 mmol/HCl 50 ml) was added thereto. The mixture was stirred at room temperature for about 2 hr and was then stirred with heating at 60° C. for about 30 min. After the completion of the reaction, the resultant precipitate was collected by filtration. A 3 N aqueous sodium hydroxide solution was added to the collected precipitate, followed by extraction with ether. The filtrate was concentrated, and a 3 N aqueous sodium hydroxide solution was then added to the concentrate. The mixture was extracted with ether. The extract was washed with water, was then dried over sodium sulfate, and was concentrated to give 4-decyloxyaniline 3 as a reddish orange liquid (23.4 g, 92.7%).

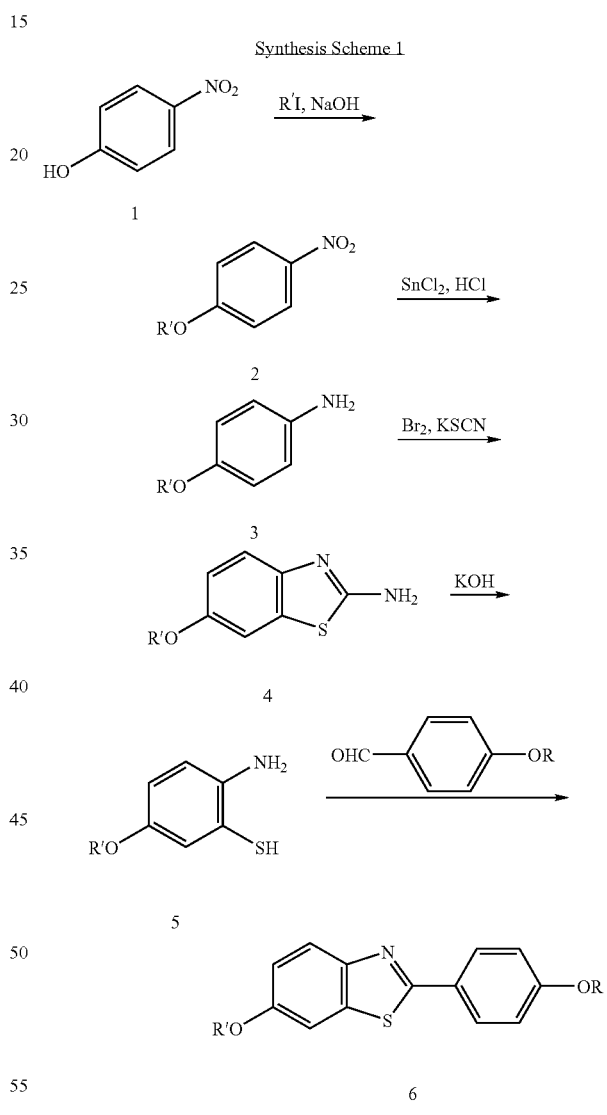

Next, acetic acid (100 ml) was added to the 4-decyloxyaniline 3 (23.4 g, 93.7 mmol) thus obtained, and potassium thiocyanate (23.5 g, 242 mmol) was then added thereto. The solution was thoroughly cooled in an ice bath, and an acetic acid solution of bromine (5.8 ml/50 ml) was then added dropwise thereto over a period of about 3 hr. After the completion of the dropwise addition of the solution, the mixture was stirred at room temperature for about 2 hr. Thereafter, water (200 ml) was added, and the mixture was refluxed for about 30 min and was then hot-filtered. The filtrate was made alkaline by the addition of aqueous ammonia, and saturated brine was further added thereto. The precipitated solid was collected by filtration to give 2-amino-6-decyloxybenzothiazole 4 (14.22 g, 49.5%) as a light purple solid. The product was purified by column chromatography on silica gel (hexane: AcOEt=1:2).

Next, potassium hydroxide (14.0 g, 250 mmol) and water (14 ml) were added to the 2-amino-6-decyloxybenzothiazole 4 (3.98 g, 12.9 mmol) thus obtained, and the mixture was stirred with heating at 150 to 180° C. for about 3 hr. After the disappearance of the starting material was confirmed by TLC, the reaction solution was neutralized with a 6 N aqueous hydrochloric acid solution. The precipitated yellow solid was extracted with methylene chloride to give 2-amino-4-decyloxythiophenol 5 (3.61 g, 98.8%).

Next, a DMSO solution of 4-hexyloxy-benzalydehyde (2.7 g, 13.1 mmol) was added to 2-amino-4-decyloxythiophenol 5 (3.61 g, 12.8 mmol) prepared above, and the mixture was stirred with heating in an argon gas stream at 150° C. for about 2 hr. After the completion of the reaction, water and sodium chloride were added thereto, and the resultant precipitate was collected by filtration and was dried. The solid substance thus obtained was recrystallized from ethanol, followed by column chromatography on silica gel (hexane:$CH_2Cl_2$=1:2) to give 2-(4'-hexyloxyphenyl)-6-decyloxy-benzothiazole 6 as a white solid (hereinafter referred to as "6O-PBT-O10," 1.2 g, 20.0%).

The 6O-PBT-O10 thus obtained was subjected to step 1 (a), step 2, step 1 (b), step 3, and step 1 (c) in that order for purification. Steps 1 to 3 will be described.

(1) Step 1

6O-PBT-O10 prepared above was dissolved in methylene chloride to prepare a solution which was then filtered through a glass filter to remove impurities. The filtrate was then subjected to recrystallization from acetone for electronic industry applications in an argon gas stream. Steps 1 (a), 1 (b), and 1 (c) mean that the recrystallization was carried out in three stages.

(2) Step 2

6O-PBT-O10 was dissolved in THF to prepare a solution. Activated carbon was added to the solution, and the mixture was stirred with heating at 50° C. for about 30 min. The activated carbon was removed by filtration, and THF was then removed by evaporation with a rotary evaporator.

(3) Step 3

6O-PBT-O10 was dissolved in a methylene chloride/hexane mixed solvent (methylene chloride: hexane=2:1) to prepare a solution which was then subjected to column chromatography on silica gel.

Impedance properties of the organic semiconductor material purified by the above steps were measured using an impedance/gain-phase analyzer SI-1260 (manufactured by SOLARTRON) and a hot stage FP 82 HT/controller FP 80 HT (manufactured by METTLER). Further, an opposed electrode cell comprising glass substrates each provided with an ITO electrode having a size of 10×5 mm$^2$ was also used. The cell gap was 9 μm, and the organic semiconductor material was poured into the cell and was kept at 120° C. to bring the material to an isotropic phase. In this state, the impedance was measured. Measurement conditions were as follows.

Impressed AC voltage: 1 V

Bias DC voltage: not applied

Frequency range: 0.1 to 1 MHz

Sample temp.: about 120° C.

FIG. 1 shows the results of measurement of impedance characteristics of the organic semiconductor material in Example 1. In FIG. 1, "BEFORE PURIFICATION" refers to the results of measurement after the completion of step 1 (a), "PURIFYING IN PROGRESS" refers to the results of measurement after the completion of step 1 (b), and "AFTER PURIFICATION" refers to the results of measurement after the completion of step 1 (c). It was found that, for the organic semiconductor material after the completion of the purification in Example 1, the phase angle θ of impedance was in the range of $-80° \leq \theta \leq -90°$ as measured in a frequency f range of 100 Hz$\leq$f$\leq$1 MHz.

Figure 2:
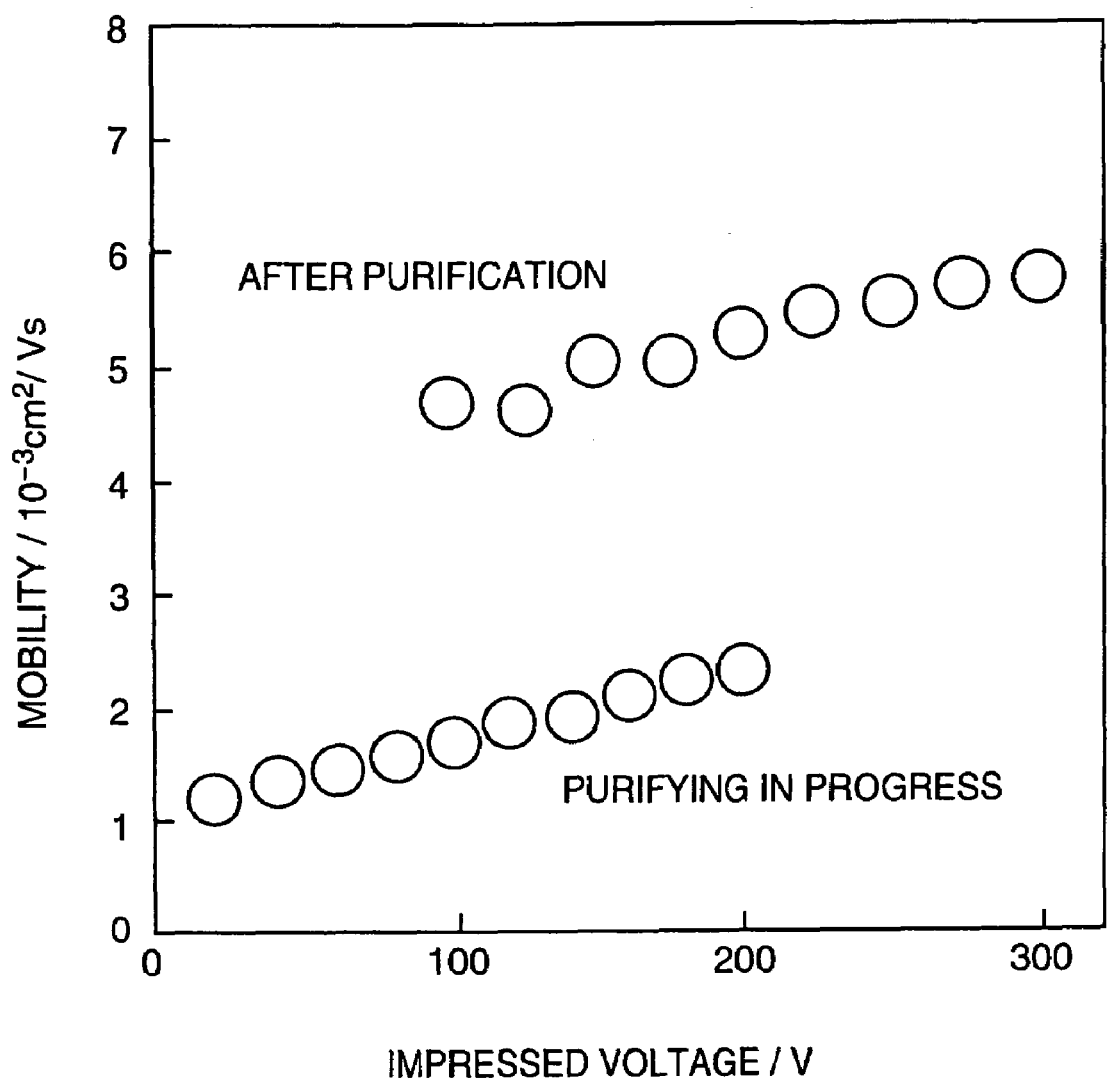
FIG. 2 is a diagram showing the results of measurement of charge mobility characteristics of an organic semiconductor material prepared in Example 1.

The charge mobility of the organic semiconductor material having the above impedance characteristics was measured by a TOF method (a time-of-flight method). In the measurement of the charge mobility, the sample was excited by an $N_2$ pulse laser with a wavelength of 337 nm. The organic semiconductor material was poured into an ITO opposed electrode cell (cell gap: 9 μm, electrode size: 10 mm×5 mm). Thereafter, the organic semiconductor material was cooled to 25° C. to bring the material to a crystalline phase. FIG. 2 shows the results of measurement of charge mobility characteristics of the organic semiconductor material of Example 1. The charge mobility of the purified organic semiconductor material of Example 1 was found to be not less than $5 \times 10^{-3}$ cm$^2$V$^{-1}$ s$^{-1}$.

Example 2

A bisbenzothiazole derivative (2,6-di(4-hexadecyloxyphenyl)benzo[1,2d:4,5-d']bisthiazole; hereinafter often abbreviated to "16O-PBBTP-O16") was synthesized as an organic semiconductor material according to the procedure shown in synthesis scheme 2 below.

At the outset, a solution of 4-hexadecyloxy-benzoyl chloride 2 (9.5 g, 24.9 mmol) in toluene (100 ml) was added at room temperature dropwise to a solution of 2,5-dichloro-1, 4-phenylenediamine 1 (2.0 g, 11.3 mmol) and triethyl amine (2.52 g, 24.9 mmol) in toluene (100 ml), and the mixture was stirred for about one hr and was then heated under reflux for about 2 hr. After the completion of the reaction, toluene as the solvent was substantially completely removed by evaporation. Ethanol was added to the residue, and the precipitated white brown powder was collected by filtration, was washed with ethanol, and was dried. Thereafter, the white powder thus obtained was recrystallized from DMF to give 1,4-bis (4-hexadecyloxyphenyl)benzoylamino-2,5-dichloro-benzene 3 as the target compound (yield 91.7%).

Next, a Lawesson's reagent (2.2 g, 5.5 mmol) and chlorobenzene (20 ml) were added to 1,4-bis(4-hexadecyloxyphenyl)benzoylamino-2,5-dichloro-benzene 3 (4.0 g, 4.6 mmol) prepared above, and the mixture was heated under reflux for about 4 hr. After the completion of the reaction, the precipitated yellow powder was collected by filtration, was washed with ethanol, and was dried. Thereafter, the yellow powder thus obtained was recrystallized from DMF to give 1,4-bis(4-hexadecyloxyphenyl)thiobenzoylamino-2,5-dichloro-benzene 4 as the target compound (yield 90.2%).

Synthesis Scheme 2

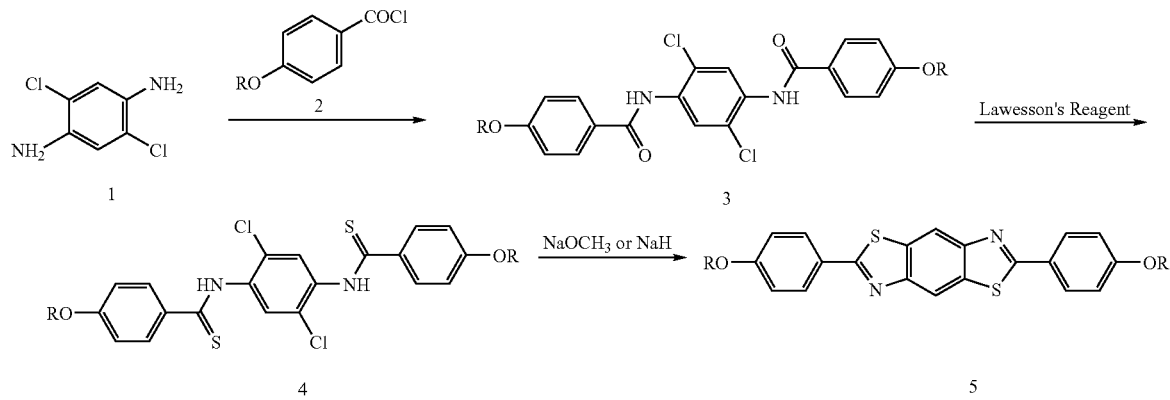

Sodium methoxide (442 mg, 8.2 mmol) and N-methyl-2-pyrrolidone (20 ml) were then added to 1,4-bis(4-hexadecyloxyphenyl)thiobenzoylamino-2,5-dichloro-benzene 4 (3.5 g, 3.9 mmol) prepared above. The mixture was stirred with heating at 150° C. for about 2 hr and then at 200° C. for about one hr. After the completion of the reaction, water was added thereto, and the precipitated yellow powder was collected by filtration, was washed with carbon bisulfide and ethanol, and was dried. Thereafter, the white powder thus obtained was recrystallized from N-methyl-2-pyrrolidone to give 2,6-di(4-hexadecyloxyphenyl)benzo[1,2d:4,5-d'] bisthiazole 5 (16O-PBBTP-O16) as the target compound (yield 95.5%).

The 16O-PBBTP-O16 thus obtained was purified. The purification was carried out by recrystallization five times from distilled N-methyl-2-pyrrolidone in an argon gas stream.

For 16O-PBBTP-O16 after the purification, the impedance characteristics and charge mobility characteristics were measured in the same manner as in Example 1.

As a result, for the organic semiconductor material of Example 2, the phase angle θ of impedance was in the range of $-80° \leq \theta \leq -90°$ as measured in a frequency f range of 100 Hz$\leq$f$\leq$1 MHz, and the charge mobility was not less than $5 \times 10^{-2}$ cm$^{-2}$V$^{-1}$ s$^{-1}$.

In this case, the charge mobility is the results as measured for a high order Sm phase at 150° C.

The invention claimed is:

1. An organic semiconductor element comprising a functional layer comprising an aligned organic semiconductor material wherein the organic semiconductor material has rodlike low-molecular smectic liquid crystallinity, and comprises a skeleton structure comprising: L 6π electron aromatic rings, M 10π electron aromatic rings, and N 14π electron aromatic rings, wherein L, M, and N are each an integer of 0 (zero) to 4 and L+M+N=1 to 4; and a terminal structure attached to both ends of said skeleton structure, said terminal structure developing smectic liquid crystallinity, the charge mobility of said organic semiconductor material is not less than $5 \times 10^{-3}$ cm$^2$ V$^{-1}$s$^{-1}$ when in a crystalline phase and not less than $5 \times 10^{-2}$ cm$^2$V$^{-1}$ s$^{-1}$ when in a liquid crystal phase, and the phase angle θ of impedance of said organic semiconductor material is $-80° \leq \theta \leq -90°$ as determined in the measurement of impedance in a frequency f range of 100 Hz$\leq$f$\leq$1 MHz when said organic semiconductor material in an isotropic phase state is held between a pair of opposed substrates with an interelectrode spacing of 9 μm, wherein the functional layer has been formed by heating said organic semiconductor material to a temperature high enough for the organic semiconductor material to exhibit at least a smectic phase and then cooling the organic semiconductor material, and at least a part of the organic semiconductor material is in an aligned crystal phase.

2. A process for producing the organic semiconductor element of claim 1, said process comprising: providing an organic semiconductor material that has rodlike low-molecular smectic liquid crystallinity, and comprises a skeleton structure comprising: L 6π electron aromatic rings, M 10π electron aromatic rings, and N 14π electron aromatic rings, wherein L, M, and N are each an integer of 0 (zero) to 4 and L+M+N=1 to 4; and a terminal structure attached to both ends of said skeleton structure, said terminal structure developing smectic liquid crystallinity; repeatedly purifying the organic semiconductor material to remove impurities such that the organic semiconductor material has a charge mobility not less than $5 \times 10^{-3}$ cm$^2$V$^{-1}$s$^{-1}$ when in a crystalline phase and not less than $5 \times 10^{-2}$ cm$^2$V$^{-1}$s$^{-1}$ when in a liquid crystal phase, and the phase angle θ of impedance of said organic semiconductor material is $-80° \leq \theta \leq -90°$ as determined in the measurement of impedance in a frequency f range of 100 Hz$\leq$f$\leq$1 MHz when said organic semiconductor material in an isotropic phase state is held between a pair of opposed substrates with an interelectrode spacing of 9 μm; heating said organic semiconductor material to a temperature high enough for the organic semiconductor material to exhibit at least a smectic phase and then cooling the organic semiconductor material so that at least part of the organic semiconductor material is in a crystal phase.

* * * * *